(12) United States Patent
Singh et al.

(10) Patent No.: US 9,291,670 B2
(45) Date of Patent: Mar. 22, 2016

(54) OPERATING SURFACE CHARACTERIZATION FOR INTEGRATED CIRCUITS

(71) Applicant: Apple Inc., Cupertino, CA (US)

(72) Inventors: Preminder Singh, Belmont, CA (US); Sung Wook Kang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 137 days.

(21) Appl. No.: 14/168,177

(22) Filed: Jan. 30, 2014

(65) Prior Publication Data

US 2015/0212120 A1    Jul. 30, 2015

(51) Int. Cl.
| | |
|---|---|
| *H01L 25/00* | (2006.01) |
| *G01R 31/30* | (2006.01) |
| *G06F 1/32* | (2006.01) |
| *G01R 31/28* | (2006.01) |
| *H01L 21/66* | (2006.01) |

(52) U.S. Cl.
CPC ............ *G01R 31/3004* (2013.01); *G06F 1/324* (2013.01); *G01R 31/2879* (2013.01); *H01L 22/34* (2013.01)

(58) Field of Classification Search
CPC ..... E21B 36/04; E21B 43/24; E21B 43/2401; Y10T 29/49083
See application file for complete search history.

(56) References Cited

U.S. PATENT DOCUMENTS

| | | | |
|---|---|---|---|
| 7,142,996 B2 | 11/2006 | Patel et al. | |
| 7,475,366 B2 | 1/2009 | Kuemerle et al. | |
| 8,421,495 B1 | 4/2013 | Anemikos et al. | |
| 2012/0013353 A1* | 1/2012 | Frech et al. | 324/649 |
| 2013/0124133 A1 | 5/2013 | Anemikos et al. | |

OTHER PUBLICATIONS

U.S. Appl. No. 13/868,540, filed Apr. 23, 2013, Preminder Singh.

* cited by examiner

*Primary Examiner* — Sibin Chen
(74) *Attorney, Agent, or Firm* — Meyertons, Hood, Kivlin, Kowert & Goetzel, P.C.; Gareth M. Sampson; Lawrence J. Merkel

(57) ABSTRACT

A device includes an integrated circuit programmed with an operating surface equation. The operating surface equation may define an operating point as a function of operating voltage, operating frequency, and leakage current. The operating surface equation may be generated by fitting a surface equation to data for operating voltage and operating frequency versus leakage current for a plurality of test integrated circuits. An operating voltage of the integrated circuit at a given operating frequency may be determined by the operating surface equation and a leakage current value fused into the device.

20 Claims, 8 Drawing Sheets

OPERATING SURFACE CHARACTERIZATION FOR INTEGRATED CIRCUITS

BACKGROUND

1. Field of the Invention

The present invention relates to semiconductor devices and methods for testing and characterizing semiconductor devices. More particularly, the invention relates to characterization, testing, and binning of semiconductor devices such as integrated circuits.

2. Description of Related Art

Overall power consumption for semiconductor devices (e.g., semiconductor integrated circuits (ICs) such as logic or memory ICs) is a combination of dynamic (active) power consumption and static (leakage) power consumption. As devices have reduced in size and the power requirements (especially dynamic power requirements) have been reduced, static power consumption has become a more significant factor in overall power consumption for integrated circuits and semiconductor devices. Static power consumption is especially important in portable electronic devices as static (idle) power consumption directly affects battery life. Thus, the control and optimization of static power consumption is increasingly needed for the production of semiconductor devices used in portable electronic devices as well as other electronic devices.

Variations during the manufacturing of integrated circuits (e.g., variations during IC processing) may cause variation between integrated circuits that are manufactured to the same design specifications. For example, manufacturing variations such as, but not limited to, equipment variations, position on a wafer, process fluctuations, and/or operator variations may cause one or more parameters to vary between integrated circuits formed on the same wafer, integrated circuits formed in the same lot (batch), and/or integrated circuits formed on different wafers in different lots. Because of these manufacturing variations, integrated circuits with the same design may have different static power consumption characteristics. Using integrated circuits with excessive power consumption may lead to decreased battery life and/or decreased operational lifetime in electronic devices such as portable electronic devices. Thus, in order to maintain desired levels of battery life and/or operational lifetime, some integrated circuits may have to be "failed" because their static and/or dynamic power consumption is too high (e.g., power consumption that would lead to unacceptable battery life) and/or the voltage supplied to the integrated circuit may be limited to avoid excessive power consumption.

Binning of integrated circuits may be used to sort manufactured integrated circuits based on their static (or dynamic) power consumption. Post-manufacturing binning may be used to separate the manufactured integrated circuits into different bins based on worst-case static power consumption of each integrated circuit after testing of leakage currents in the integrated circuits at one or more voltage levels. Binning allows integrated circuits with higher static leakage currents to be accepted while maintaining the worst-case static power consumption at acceptable levels (e.g., by limiting the supply voltage provided to the integrated circuit). Binning the integrated circuits allows the integrated circuits to be sorted for use in selected products (e.g., selected portable electronic devices) based on the worst-case power consumption or maximum supply voltage for each bin. Binning of manufactured integrated circuits with multiple bins may produce better average power (static and/or dynamic) and better manufacturing yield, which reduces costs.

A drawback to binning is the time used to test and bin the integrated circuits after manufacturing the integrated circuits. Testing the integrated circuits at more voltages (e.g., bin voltages) requires more test time but can produce better average power and higher yield. Reducing the number of test voltages (bin voltages) to decrease test time, however, reduces average power and decreases yield. The number of bins used, therefore, may be a balance between time and desired power and/or yield. The number of bins may be reduced by tailoring the bins to more closely represent the population data.

Another drawback to most current binning schemes is that testing may be limited to a single operating frequency or a small operating frequency range. Because the integrated circuit is binned at only the single operating frequency or in the small operating frequency range, operation of the integrated circuit is limited to the single operating frequency or the small operating frequency range. Such limits in the operating frequency limits the ability of the integrated circuit (e.g., the CPU or the SoC) to be used for multiple programs or operations that require wide ranges of operating frequencies. Increasing the frequency range of the integrated circuit may be possible with further characterization (e.g., binning at other frequencies); however, further characterization increases testing time.

SUMMARY

In certain embodiments, an operating surface equation is determined using a characterization process. The characterization process may include measuring leakage current and operating voltage of one or more integrated circuits at randomly selected operating frequencies. In some embodiments, the integrated circuits are selected from corner lot fabricated integrated circuits. The randomly selected operating frequencies may be positioned within a desired operating frequency range. The desired operating frequency range may be divided into two or more portions (e.g., substantially equal portions). Each of the randomly selected operating frequencies may be located within a different portion of the desired operating frequency range. Each of the integrated circuits may be tested at different randomly selected operating frequencies. The corner lot integrated circuits may have a wide range of leakage current values. Thus, measurement of the leakage currents and operating voltages of the integrated circuits provides a wide range of data for operating voltage and operating frequency versus leakage current.

In certain embodiments, at least one operating surface equation is fitted to the operating voltage and operating frequency versus leakage current data. Each operating surface equation defines an operating point for the integrated circuit as a function of operating voltage, operating frequency, and leakage current.

In certain embodiments, a device includes an integrated circuit programmed with the operating surface equation. In some embodiments, the operating surface equation is fused into the integrated circuit. The operating voltage of the integrated circuit at a given operating frequency may be determined by the operating surface equation and a leakage current value fused into the device. In some embodiments, the operating surface equation is programmed into software executable by a processor (e.g., the device and/or the integrated circuit). In some embodiments, the operating surface equation is stored as program instructions in a computer readable storage medium (e.g., a non-transitory computer readable storage medium) and the operating surface equation is executable by a processor (e.g., the device and/or the integrated circuit).

In certain embodiments, one or more integrated circuits are binned using operating surfaces defined by one or more operating surface equations. Binning may include measuring a leakage current of an integrated circuit at a selected operating voltage and a selected operating frequency. The measured leakage current may be used to determine one or more operating points along one or more operating surfaces for testing the integrated circuit. The integrated circuit may be tested to ensure correct functionality of the integrated circuit at the operating points along the operating surfaces. The integrated circuit may be assigned an operating surface equation that corresponds to a lowest operating surface at which the integrated circuit passed the test at a specified number of operating points on the operating surface.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
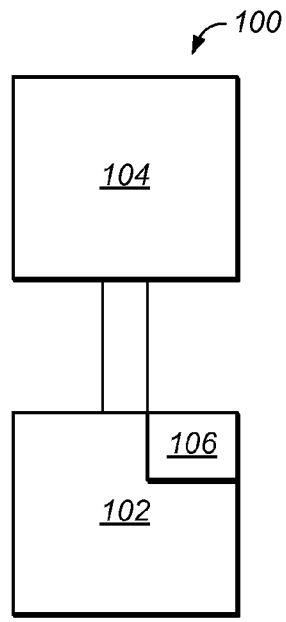
FIG. 1 depicts a schematic representation of an embodiment of a semiconductor device with an integrated circuit and a power supply.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

FIG. 1 depicts a schematic representation of an embodiment of a semiconductor device with an integrated circuit and a power supply. Device 100 includes integrated circuit 102 and power supply 104. Integrated circuit 102 may be, for example, a memory or logic integrated circuit (die). In certain embodiments, integrated circuit 102 is a semiconductor based device. Integrated circuit 102 may be coupled to power supply 104. Power supply 104 provides a supply (operating) voltage to integrated circuit 102 for operation of the integrated circuit. Power supply 104 may, for example, provide power for logic and/or memory functions (operations) in integrated circuit 102 at one or more selected operating voltages.

In some embodiments, integrated circuit 102 is provided with more than one supply voltage. For example, integrated circuit 102 may include both logic and memory functions and operate at separate supply voltages for each function. The supply voltages for each function may be set at different values (e.g, the supply voltages are not identical). In some embodiments, power supply 104 provides power for each function of integrated circuit 102 (e.g., for both logic and memory functions). In some embodiments, one or more additional power supplies are used to provide power for additional functions in integrated circuit 102 (e.g., power supply 104 provides power for the logic function while another power supply provides power for the memory function).

In some embodiments, integrated circuit 102 is operable at different frequencies. The operating frequency of integrated circuit 102 may be adjusted (e.g., raised or lowered) based on operational needs. For example, the operating frequency of integrated circuit 102 may be higher for high performance operations and lower for low performance operations. In some embodiments, supply voltage provided to integrated circuit 102 is adjusted in combination with the operating frequency of the integrated circuit.

In certain embodiments, integrated circuit 102 includes fuse block 106. Fuse block 106 may include one or more fuse programming circuits. In some embodiments, fuse block 106 includes one or more fuses programmed for responding to current (e.g., leakage current) in integrated circuit 102.

Figure 2:
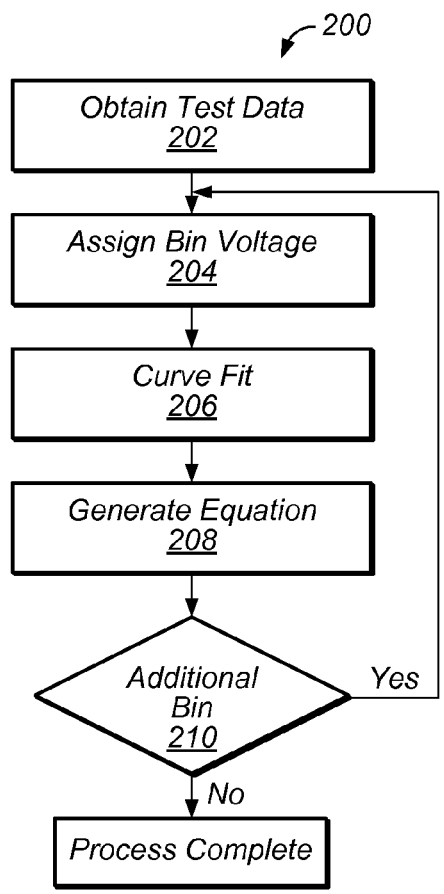
FIG. 2 depicts a flowchart of an embodiment for creating and assigning bins used for binning integrated circuits.

FIG. 2 depicts a flowchart of an embodiment for creating and assigning bins used for binning integrated circuits (e.g., integrated circuit 102). Process 200 for creating and assigning bins using testing data begins with "Obtain test data" 202. "Obtain test data" 202 includes obtaining testing data of operating voltage versus leakage current for one or more test integrated circuits. The test integrated circuits used for obtaining the testing data in 202 may be, for example, integrated circuits with a selected circuit design (e.g., a logic or memory circuit design). The selected circuit design may be the same design, or a substantially similar design, to a circuit design for integrated circuits that will be used in one or more devices (e.g., device 100).

Figure 3:
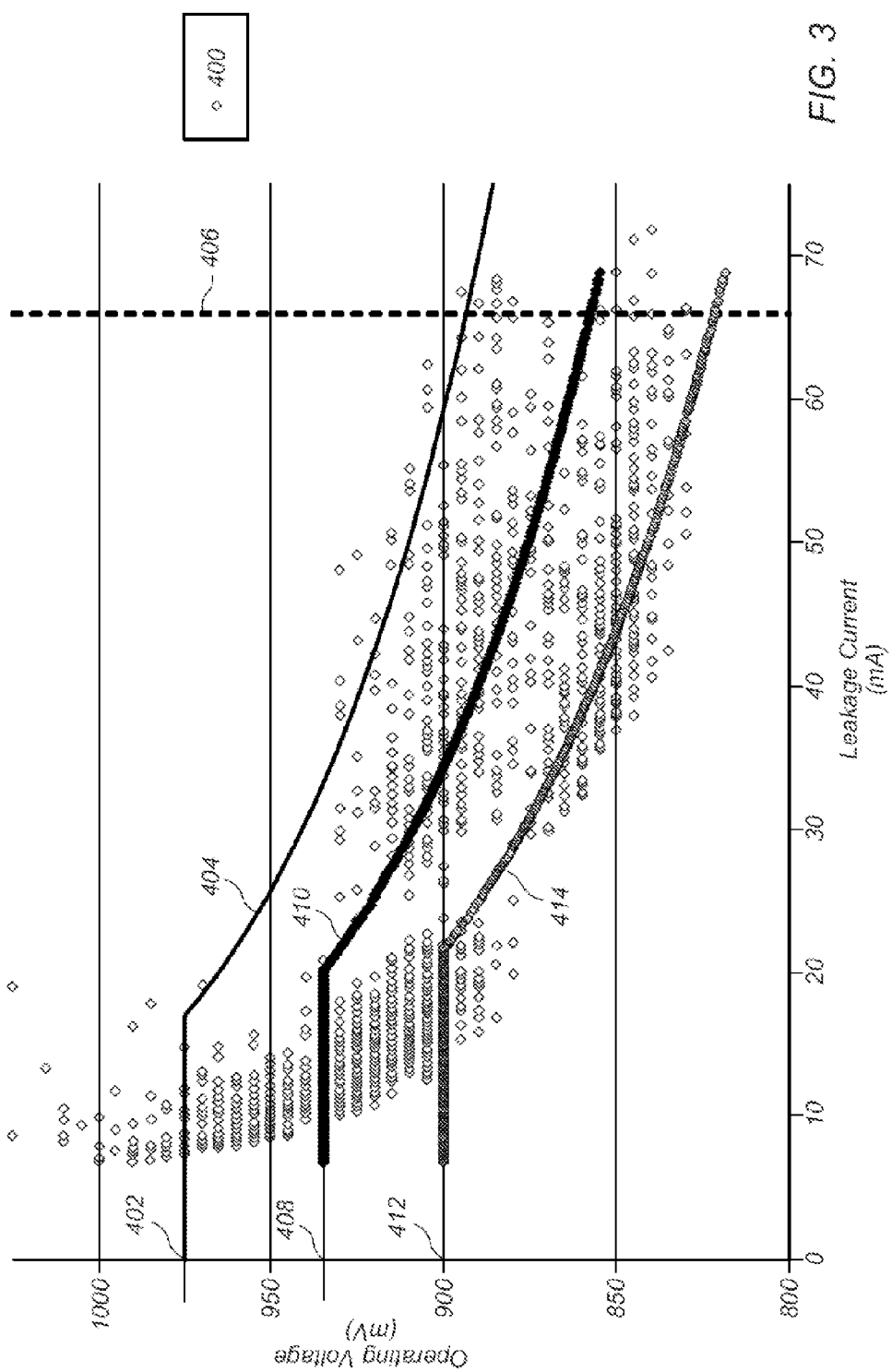
FIG. 3 depicts one embodiment of a plot of population testing data with operating voltage versus leakage current data.

Obtaining the testing data in 202 may include measuring leakage currents at a plurality of operating voltages provided to the test integrated circuits. Operating voltages that may be tested include, but are not limited to, logic supply voltage, memory supply voltage, and Input/Output supply voltage. The testing data then includes a "population" of operating voltage versus leakage current data for the selected circuit design. FIG. 3 depicts one embodiment of a plot of population testing data with operating voltage versus leakage current data 400 represented by diamond symbols.

After obtaining the testing data in 202, an initial bin operating voltage is assigned to the testing data in "Assign bin voltage" 204, as shown in FIG. 2. In 204, the initial bin operating voltage may be assigned based on a selected power output for the selected circuit design. The selected power output may be selected to correspond to operating characteristics of a desired device implementing the selected circuit design. For example, the selected power output may correspond to allowable static power drain in the desired device. The selected power output may be different based on the desired device implementing the selected circuit design. For example, certain devices may have larger batteries and, thus, may be able to withstand higher static power drain without adversely affecting battery life. In the embodiment of testing data shown in FIG. 3, initial bin voltage 402 is set at about 975 mV.

After assigning the initial bin operating voltage in 204, a curve may be fit to the testing data (e.g., data 400 in FIG. 3) in "Curve fit" 206, as shown in FIG. 2. In certain embodiments, the curve is fit to the testing data using the assigned initial bin voltage as a maximum operating voltage allowed for the curve. For example, as shown in FIG. 3, curve 404 is fit to data 400 with initial bin voltage 402 as the maximum operating voltage for the curve. Thus, curve 404 is fit to intercept a horizontal line representing initial bin voltage 402 at some point within the population of data 400. In some embodiments, the horizontal line representing initial bin voltage 402 becomes part of curve 404. Curve 404 may be fit using standard curve fitting operations (e.g., curve fitting algorithms or curve fitting software) known in the art. In some embodiments, curve 404 is fit using an exponential curve fitting operation. It is to be understood that curve 404 is not limited to an exponential curve fit or any typical curvature shape and that the curve may have any shape possible depending on the testing data population. For example, curve 404 may include one or more additional horizontal portions other than the horizontal line portion representing the initial bin voltage.

After fitting the curve in 206, an equation may be generated to describe the curve (e.g., curve 404 in FIG. 3) in "Generate equation" 208, as shown in FIG. 2. In certain embodiments, one equation is generated that describes both the horizontal line representing the initial bin voltage (e.g., initial bin voltage 402 in FIG. 3) and the curve fitting the data (e.g., curve 404 in FIG. 3). In some embodiments, more than one equation is generated to describe the curve. For example, one equation may describe the initial bin voltage while a second equation describes the curve.

In some embodiments, the equation is generated from curve fit data (e.g., the equation is fit to data that represents curve 404 and/or the horizontal line representing initial bin voltage 402, shown in FIG. 3). In certain embodiments, the equation describing the curve is generated during fitting of the curve. For example, an equation may be generated while fitting curve 404 to the testing data with initial bin voltage 402 set as the maximum voltage for the equation. The equation generated to describe curve 404 may be used later during testing and operation of an integrated circuit.

As shown in FIG. 3, curve 404, and the equation generated from the curve, is an upper boundary for a "bin" of integrated circuits. Thus, integrated circuits that have an operating voltage versus leakage current data point above curve 404 are considered to "fail" (e.g., static power consumption is too high) while integrated circuits that have an operating voltage versus leakage current data point below curve 404 are considered to "pass" (e.g., static power consumption is at an acceptable level).

Unlike rectangular bins, which are commonly used for binning integrated circuits, a bin created using curve 404 better represents the distribution in the testing data population. Creating the bin using curve 404 generates a bin that does not have a fixed voltage, unlike a rectangular bin, which has a fixed voltage based on the upper voltage limit of the bin. The bin using curve 404 has a voltage that varies with leakage current as described by the equation generated to describe the curve. Thus, the bin using curve 404, as shown in FIG. 3, has voltage values that decrease with increasing leakage current above a leakage current of about 18 mA.

Using curve 404 and the equation describing the curve to define the bin provides more accurate representation of the testing data population and may allow fewer bins to be used to cover the testing data population. Reducing the number of bins used to cover the testing data population may reduce test time while maintaining yield and average power for a batch of integrated circuits tested using the bins. In some embodiments, it may be possible to use only one bin to accurately describe the testing data population because of the variable voltage within the bin. In addition, having bins with variable voltage within the bin allows integrated circuits that are tested and binned using such bins to be operated at individual operating voltages defined by the equation describing the curve.

With rectangular bins, some later tested integrated circuits that are potentially acceptable can be failed because the square corners of the rectangular bins create "failure pockets" where acceptable power drain levels actually exist. Because curve 404 is fit to represent the population data, however, the bin created by the curve identifies integrated circuits in these pockets as acceptable integrated circuits. Additionally, rectangular bins have a tendency to capture (e.g., pass) integrated circuits that have test data that lie generally away from the actual testing data population. Though these integrated circuits are passed, these integrated circuits are generally unacceptable and prone to problems because they have operating characteristics that are largely different from the general population. Because curve 404 creates a bin that better represents the testing data population, however, such integrated circuits are failed during testing using the bin created by the curve.

In certain embodiments, an upper limit (shown by line 406 in FIG. 3) is also placed on the leakage current. The leakage current upper limit may be set, for example, to avoid leakage currents at unacceptable levels regardless of operating voltage. Thus, any integrated circuit with a leakage current above the upper limit line 406 will fail regardless of its operating voltage at that leakage current. The leakage current upper limit may be assigned at any point during process 200, shown in FIG. 2.

In some embodiments, more than one bin is assigned to the testing data obtained in 202, shown in FIG. 2. For example, more than one bin is used if integrated circuits using the selected circuit design can be used at more than one power drain level (e.g., more than one static power drain value). The selected circuit design may be useable at more than one power drain level if, for example, more than one product will use the integrated circuits with the selected circuit design. Assigning more bins to the testing data may produce better average power and higher yield. Typically, each additional bin is assigned at a different voltage so that there are multiple "voltage bins".

If more than one bin is to be created and assigned to the testing data, "Assign bin voltage" 204, "Curve fit" 206, and "Generate equation" 208 are repeated for each additional bin. As shown in FIG. 2, after the equation is generated in 208, "Additional bin" 210 poses the question of whether an additional bin is to be created and assigned to the testing data. If "Y", the process returns to "Assign bin voltage" 204 and the process is carried out for the additional bin. If "N", the process of assigning bins is completed.

The embodiments shown in FIG. 3 depicts two additional bins created and assigned to data 400. Initial bin voltage 408 at about 940 mV is used to fit curve 410 to data 400 and generate an equation describing the curve. Initial bin voltage 412 at about 900 mV is used to fit curve 414 to data 400 and generate an equation describing the curve. Thus, as shown in FIG. 3, three bins are created and assigned to data 400. A first bin is located below curve 404 and above curve 410; a second bin is located below curve 410 and above curve 414; and a third bin is located below curve 414. Using curve fitting (e.g., curves 404, 410, and 414) to define the bins provides more uniform power consumption within each bin because the bins have voltages that vary with leakage current. Thus, using the bins defined by the curves may provide better average power and better yield within each bin.

Figure 4:
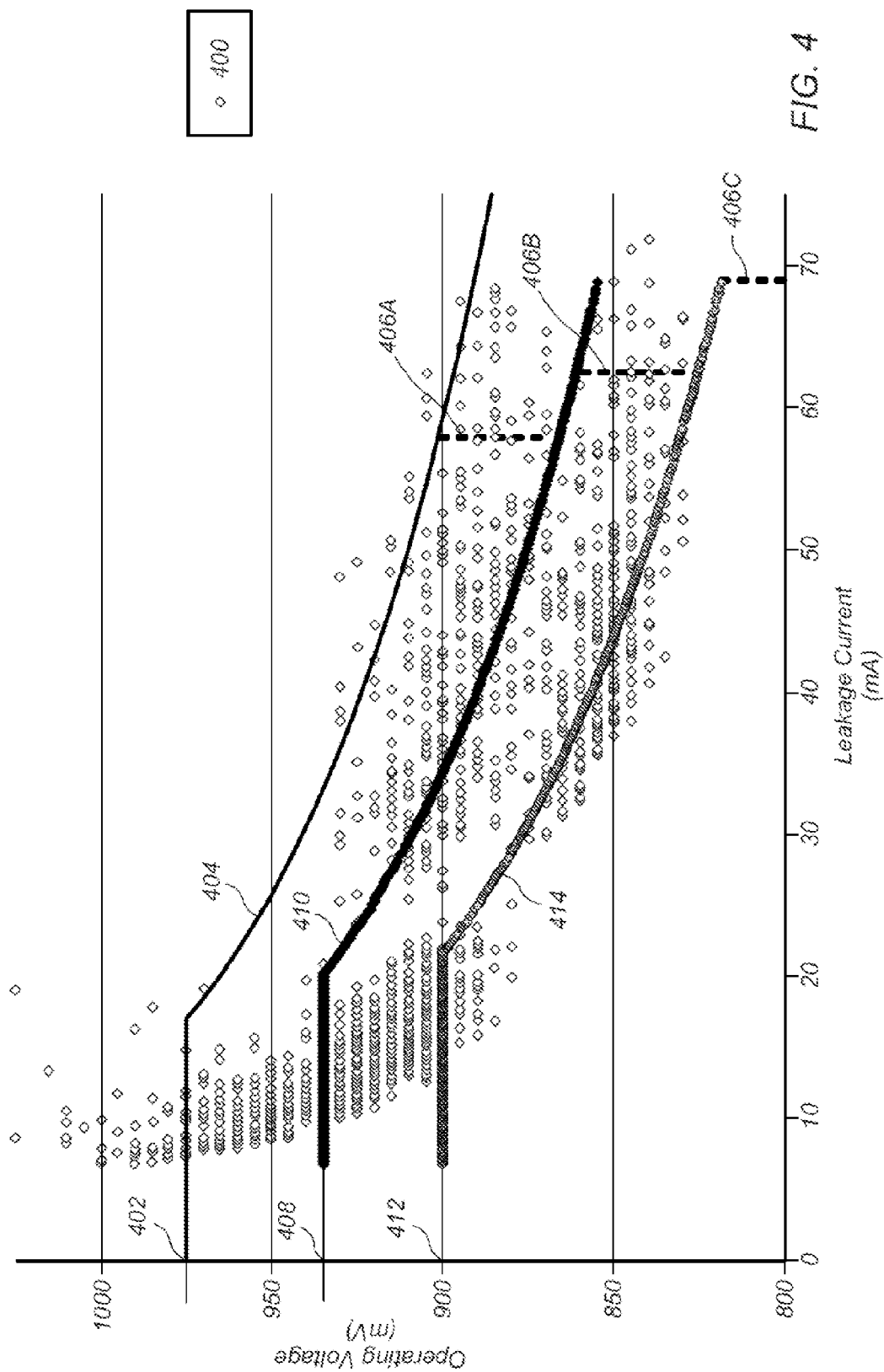
FIG. 4 depicts the plot of population testing data in FIG. 3 with different bins having different leakage current upper limits.

As shown in FIG. 3, all three bins share a common leakage current upper limit, shown by line 406. In some embodiments, each bin has a different leakage current upper limit. FIG. 4 depicts the plot of population testing data with the bins created and assigned in FIG. 3 with each bin having a different leakage current upper limit. Line 406A provides the leakage current upper limit for the bin located below curve 404 and above curve 410. Line 406B provides the leakage current upper limit for the bin located below curve 410 and above curve 414. Line 406C provides the leakage current upper limit for the bin located below curve 414. The different leakage current upper limits may be set at different values for each bin to improve average power for integrated circuits tested using the bins.

Figure 5:
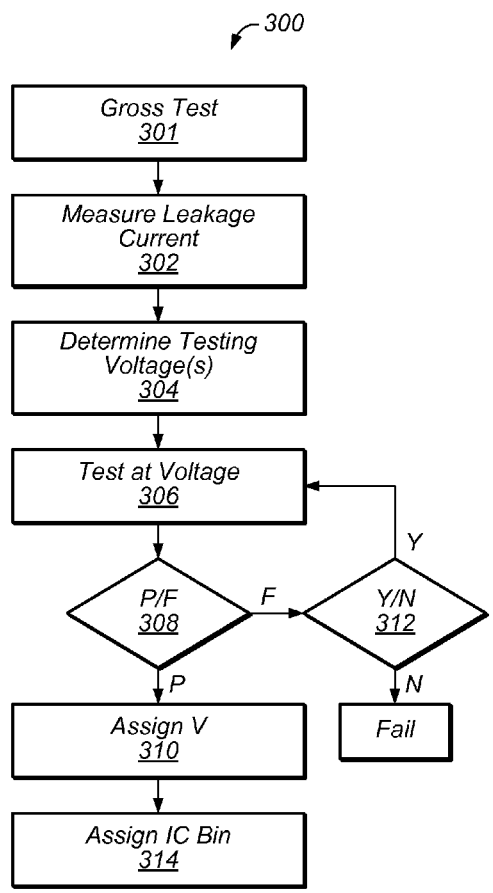
FIG. 5 depicts a flowchart of an embodiment of a binning process for binning integrated circuits.
Figure 6:
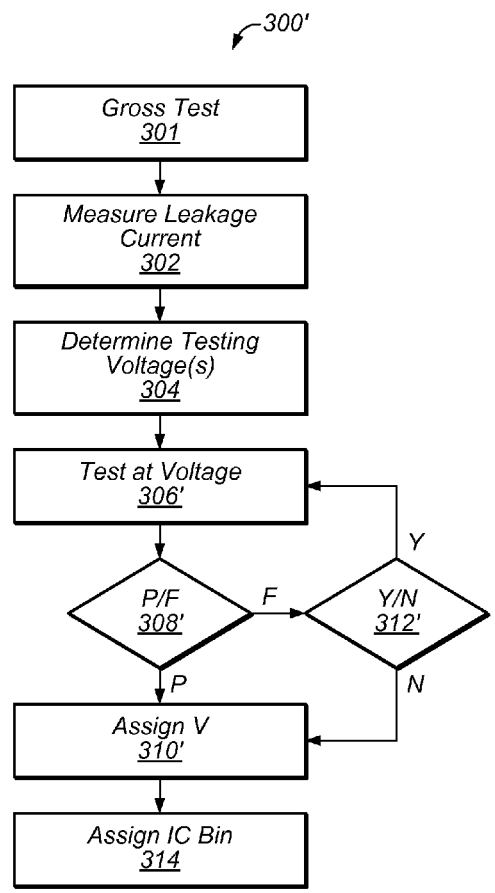
FIG. 6 depicts a flowchart of an alternative embodiment of a binning process for binning integrated circuits.

After one or more bins are created and assigned using process 200, shown in FIG. 2, the bins may be used for binning of one or more integrated circuits (e.g., testing and assigning the integrated circuits to one of the bins created). FIGS. 5 and 6 depict flowcharts of embodiments of binning process 300 and binning process 300' for binning integrated circuits with the bins created by process 200. The integrated circuits binned in process 300 or process 300' may have the same circuit design (e.g., the selected circuit design) or a substantially similar circuit design to the test integrated circuits used to create the bins in process 200.

Process 300 and process 300' may begin with testing for gross functionality of the integrated circuit at "Gross Test" 301. For example, open/short testing and/or scan testing for hard defects may be done at "Gross Test" 301. If the integrated circuit fails one of the gross functionality tests, the part may not proceed through any further testing and may be thrown away.

After gross functionality testing, process 300 and process 300' may continue with measuring the leakage current of an integrated circuit in "Measure leakage current" 302. In some embodiments, the leakage current may be measured at the highest operating voltage allowed for the selected circuit design. The leakage current may, however, be measure at any selected operating voltage (e.g., at any desired set value of the operating voltage). It is to be understood that process 300 may be used on a plurality of integrated circuits with each integrated circuit being processed through process 300. Thus, when more than one integrated circuit is binned using process 300, typically the leakage current is measured at the same selected operating voltage for each integrated circuit.

If the measured leakage current is above one or more of the leakage current upper limits (e.g., line 406 shown in FIG. 3 or lines 406A, 406B, 406C shown in FIG. 4), then the integrated circuit may not be tested at one or all of the operating voltages (e.g., the integrated circuit fails at an operating voltage if the measured leakage current is above the leakage current upper limit for the corresponding curve).

The measured leakage current for the integrated circuit may be used to determine the operating voltages at which the integrated circuit is to be tested in "Determine testing voltage(s)" 304. An operating voltage is determined from the equation describing the curve for each bin created during process 200. The number of voltages to be tested corresponds to the number of bins created during process 200. For example, if only one bin is created, then the integrated circuit may only be tested at one operating voltage determined by the curve fitted for the one bin and the integrated circuit is passed or failed based on only the one tested operating voltage. As another example, the embodiment shown in FIG. 3 has three bins and, thus, the integrated circuit may be tested at three different operating voltages determined by the curve fitted for each bin.

To determine the operating voltage in 304, the measured leakage current found in 302 is plugged into the equation for each curve created during process 200 (e.g, the intersection of the measured leakage current with each curve is found). For example, using the three bins represented by the fitted curves shown in FIG. 3, a measured leakage current of about 40 mA would provide three operating voltages for testing the integrated circuit: (a) about 920 mV from curve 404; (b) about 880 mV from curve 410; and (c) about 860 mV from curve 414. Each testing operating voltage corresponds to an intersection of the measured leakage current with each curve fitted to the testing data population. For example, 920 mV corresponds to the intersection of 40 mA with curve 404 in FIG. 3.

After determining the testing operating voltages in 304, the integrated circuit is tested at one of the testing operating voltages in "Test at voltage" 306, shown in FIG. 5, or "Test at voltage" 306', shown in FIG. 6. Testing the integrated circuit may include, but not be limited to, assessing one or more operating parameters of the integrated circuit at the tested operating voltage and passing or failing the integrated circuit based on the assessment of the operating parameters. FIG. 5 depicts a flowchart of an embodiment of binning process 300 for binning integrated circuits starting with the lowest testing operating voltage first. FIG. 6 depicts a flowchart of an alternative embodiment of binning process 300' for binning integrated circuits starting with the highest testing operating voltage first.

In process 300, shown in FIG. 5, at 306 testing begins with the lowest testing operating voltage determined in 304. At "P/F" 308, the integrated circuit is either passed or failed at the tested operating voltage. If the integrated circuit passes "P", the integrated circuit is assigned a maximum operating voltage corresponding to the test voltage at "Assign V" 310. If the integrated circuit fails "F", then the question is posed if there is another operating voltage for testing at "Y/N" 312. If "Y", then the integrated circuit is tested at another (higher) testing operating voltage in 306. If "N", then the integrated circuit is failed.

If the integrated circuit passes the test at the lowest tested operating voltage when the integrated circuit is tested at the lowest tested operating voltage first, the integrated circuit may not need to be tested at any other operating voltage because typically, it is desirable to run the integrated circuit at the lowest possible operating voltage. In addition, testing at fewer operating voltages reduces testing time. As an example, using the measured leakage current of 40 mA provided above, the integrated circuit may be tested at 860 mV first, and if the integrated circuit passes the test at that voltage, it would not be tested at either 880 mV or 920 mV. If the integrated circuit, however, failed the test at 860 mV, the integrated circuit would then be tested at 880 mV and then, if necessary, at 920 mV. As shown above, if the integrated circuit fails at all three voltages 860 mV, 880 mV, and 920 mV, then the integrated circuit is failed at 312 and is removed.

In process 300', shown in FIG. 6, at 306' testing begins with the highest testing operating voltage determined in 304. At "P/F" 308', if the integrated circuit passes "P", then the question is posed if there is another operating voltage for testing at "Y/N" 312'. If "Y", then the integrated circuit is tested at another (lower) testing operating voltage in 306'. If "N", then the integrated circuit is assigned the last testing operating voltage at "Assign V" 310'.

If the integrated circuit fails "F" at "P/F" 308' but has previously passed one or more tests at higher voltages, the integrated circuit is assigned the lowest passed testing operating voltage at "Assign V" 310'. In certain embodiments, if the integrated circuit fails its first test (e.g., the test at the highest voltage) at "P/F" 308', the integrated circuit is failed immediately (e.g., the integrated circuit is thrown out). Throwing away the failed integrated circuit after the first test reduces testing time as the integrated circuit is likely to fail the test at lower testing voltages. In some embodiments, if the integrated circuit fails its first test, the integrated circuit is retested at "Test at voltage" 306' beginning at the next highest voltage determined in 304. The integrated circuit may be retested at successive lower voltages until a highest passing test voltage is found. In some embodiments, if the integrated circuit fails its first test, the integrated circuit is tested using another binning process such as process 300, depicted in FIG. 5.

As an example of binning process 300', shown in FIG. 6, with the measured leakage current of 40 mA described above, the integrated circuit may be tested at 920 mV first. If the integrated circuit fails the test at 920 mV, the integrated circuit would be removed (thrown away). If the integrated circuit passes the test at 920 mV, it would then be tested at 880 mV. If the integrated circuit failed the test at 880 mV, the integrated circuit would then be assigned an operating voltage of 920 mV. If the integrated circuit passed the test at 880 mV, then the integrated circuit would be tested at 860 mV. If the integrated circuit failed the test at 860 mV, the integrated circuit would then be assigned an operating voltage of 880 mV. If the integrated circuit passed the test at 860 mV, then the integrated circuit would assigned an operating voltage of 860 mV (the last testing voltage).

In some embodiments, if process 300 (depicted in FIG. 5) or process 300' (depicted in FIG. 6) includes testing one or more integrated circuits for more than one bin, each integrated circuit may be assigned to a bin, at "Assign IC bin" 314, based on the lowest operating voltage at which that integrated circuit passed the test. The bins may, for example, be defined by curves 404, 410, and 414, as described above and shown in FIG. 3. Assigning each integrated circuit to a specific bin may allow each integrated circuit to be designated for a specific type of product or a specific type of use based on, for example, the average properties (e.g., power) of that bin.

At 310, an integrated circuit is assigned a maximum operating voltage that corresponds to the lowest operating voltage at which the integrated circuit passed the test. In certain embodiments, the integrated circuit is programmed with the maximum operating voltage based on the equation describing the curve for the lowest operating voltage at which the integrated circuit passed the test. For example, an integrated circuit such as integrated circuit 102 (shown in FIG. 1) may have a measured leakage current of about 40 mA at a selected operating voltage. Using the measured leakage current of 40 mA, the integrated circuit may be tested at operating voltages of 860 mV, 880 mV, and 920 mV using process 300, depicted in FIG. 5. If the integrated circuit fails the tests at 860 mV and 880 mV but passes the test at 920 mV, then the integrated circuit may be programmed with the equation that describes curve 404 (which provided the tested operating voltage of 920 mV).

In some embodiments, the equation describing the curve is programmed into the logic of the integrated circuit. In some embodiments, the equation describing the curve is programmed into a fuse block containing one or more fuses in the integrated circuit (e.g., fuse block 106, shown in FIG. 1). In certain embodiments, the measured leakage current is also programmed into the integrated circuit. The measured leakage current may be fused into the integrated circuit using, for example, fuse block 106, shown in FIG. 1.

With the equation describing the curve and the measured leakage current programmed into the integrated circuit (e.g, integrated circuit 102), device 100 may operate at an operating voltage determined using the equations and the measured leakage current. For example, with the leakage current fused into integrated circuit 102, the operating voltage for the integrated circuit may be determined using the equation describing the curve programmed into the integrated circuit (e.g., the integrated circuit calculates its operating voltage based on the fused leakage current value from the programmed equation). Thus, integrated circuit 102 may operate at the determined operating voltage, which is provided by power supply 104. In some embodiments, the programmed equations and the fused leakage current value are used to determine the frequency of the integrated circuit in addition to the operating voltage.

Programming the equations found from curve fitting of the testing data population into one or more integrated circuits and providing leakage current values into such integrated circuits (e.g., through fuse block 106) allows each integrated circuit to determine its own operating voltage within its assigned bin. Allowing each integrated circuit to determine its own operating voltage provides better average power and more efficient operating parameters for each bin as compared to rectangular binning, in which each integrated circuit in a bin is assigned the same operating voltage.

The embodiment of the curve fitting and binning process described in FIGS. 2-6 provides curve fitting and binning for operating voltage versus leakage current data at a selected frequency. For example, testing data, such as shown in FIG. 3, may be acquired at a single operating frequency or in a small, limited frequency range. Thus, an integrated circuit programmed with an equation found from such curve fitting and binning is operable only at the single operating frequency or in the small, limited frequency range. To allow operation of an integrated circuit at a wider range of frequencies, data for the curve fitting and binning may be expanded to include operating points for integrated circuits in terms of operating frequency in addition to operating voltage and leakage current (e.g., the data includes the third element of operating frequency to provide three-dimensional data of operating voltage and operating frequency versus leakage current).

Figure 7:
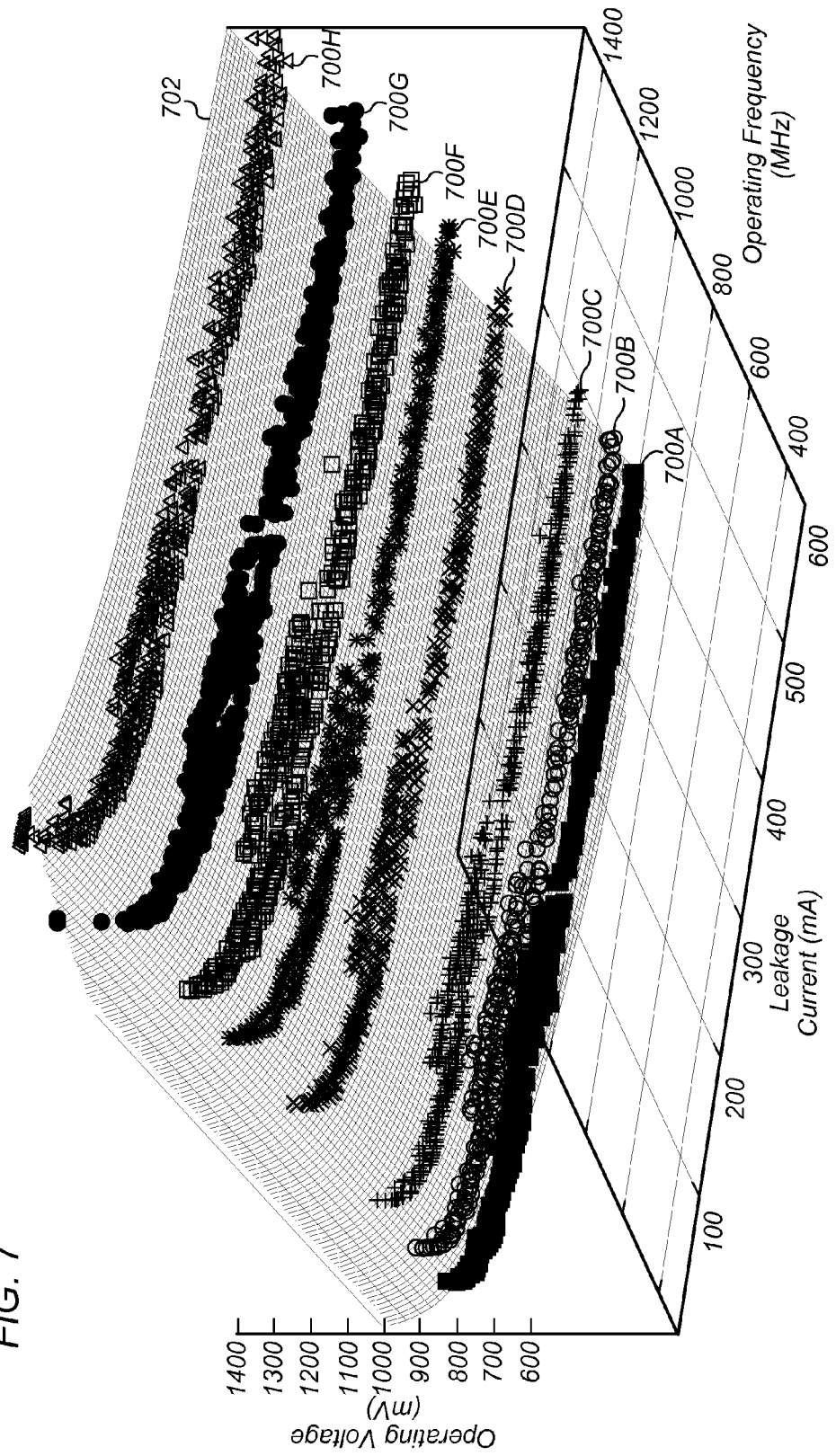
FIG. 7 depicts an embodiment of a plot of population testing data with operating voltage and operating frequency versus leakage current.

FIG. 7 depicts an embodiment of a plot of population testing data with operating voltage and operating frequency versus leakage current. Testing data 700 may be obtained by measuring leakage currents at a plurality of operating voltages and operating frequencies to produce a population of testing data for a selected circuit design. In certain embodiments, testing data is obtained by selecting an operating frequency and then measuring leakage currents at a plurality of operating voltages. For example, as shown in FIG. 7, leakage currents were measured at a plurality of operating voltages at 8 different operating frequencies (testing data 700A-H). Thus, testing data 700A is leakage current versus operating voltage data obtained at a first operating frequency while testing data 700H is leakage current versus operating voltage data at an eighth operating frequency with other testing data 700B-700G being leakage current versus operating voltage data at frequencies between the first and eighth operating frequencies.

As shown in FIG. 7, surface 702 may be fit to testing data 700. Surface 702 may be described by a surface equation (e.g., a three-dimensional equation used to describe a surface). Surface 702 may be fit using standard surface (curve) fitting operations for three-dimensional plots (e.g., surface fitting algorithms or surface fitting software for three-dimensional plots) known in the art. The surface equation fit to testing data 700 that defines surface 702 may define an operating surface for one or more integrated circuits that use the selected circuit design. In some embodiments, surface 702 is fit to testing data 700 and then a surface equation is generated to describe the surface. In some embodiments, the surface equation is generated during fitting of surface 702 to testing data 700. In some embodiments, surface 702 is described by more than one surface equation.

Figure 8:
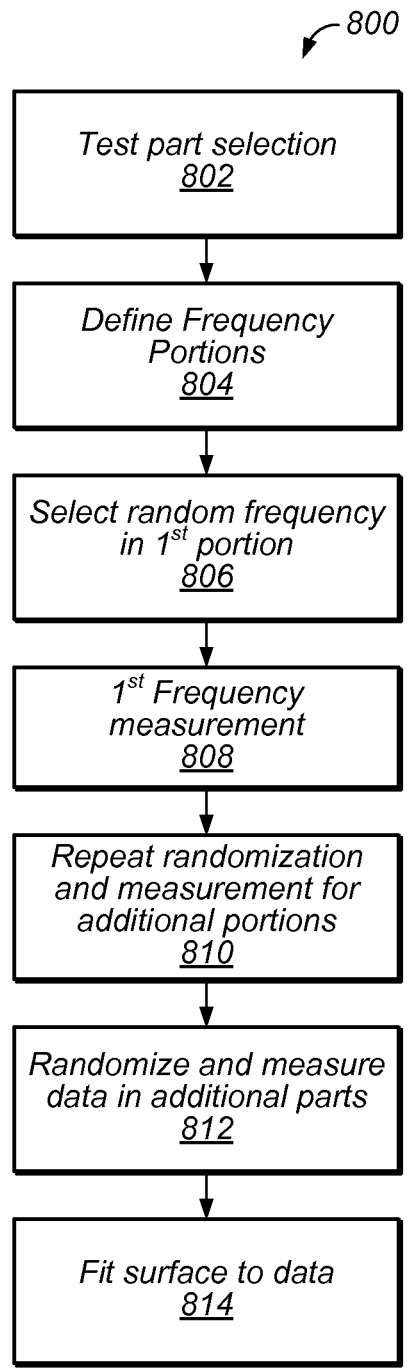
FIG. 8 depicts a flowchart of an embodiment for obtaining population testing data for operating voltage and operating frequency versus leakage current.

FIG. 8 depicts a flowchart of an embodiment for obtaining population testing data for operating voltage and operating frequency versus leakage current. Process 800 may begin with "Test part selection" 802. In 802, one or more integrated circuits are selected for testing a selected circuit design. In certain embodiments, the integrated circuits may be selected from "corner lots" made with the selected circuit design. Corner lots may be, for example, integrated circuits made on wafers that are processed at the extreme edges of the process parameters for the selected circuit design. Using integrated circuits from the corner lots may allow the tested integrated circuits to have a wide range of leakage currents (e.g., the tested circuits will cover the range of leakage currents that may be found during normal fabrication of the selected circuit design).

After selecting the test parts in 802, an operating frequency range for the selected circuit design may be divided into two or more portions in "Define frequency portions" 804. In 804, the operating frequency range for the selected circuit design is divided into portions that may be substantially equal portions (e.g., each portion comprises substantially the same size frequency range). For example, in one embodiment, the operating frequency range may be divided into 8 substantially equal frequency portions. As an example, the frequency portions may each be about 200 MHz to about 400 MHz in size.

After dividing the operating frequency range into portions in 804, a first testing operating frequency for a first test part (e.g., a first test integrated circuit) may be randomly selected in "Select random frequency in 1$^{st}$ portion" 806. The first testing operating frequency may be selected from a first operating frequency portion (e.g., a lowest frequency range). The first testing operating frequency may be randomized using any random number generator (e.g., a computer operated random number generator) to select a randomly selected operating frequency in the first operating frequency portion.

Following selection of randomly selected operating frequency in 806, leakage current and operating voltage measurements for the first test integrated circuit may be taken at the first testing operating frequency in "1$^{st}$ Frequency measurement" 808. After the measurement of leakage current and operating voltage at the first test operating frequency has been taken, steps 806 and 808 may be repeated for each additional operating frequency portion in "Repeat randomization and measurement for additional portions" 810. Thus, a leakage current and operating voltage measurement for the first test integrated circuit is taken at a randomly selected testing operating frequency in each of the frequency portions defined in 804. For example, if the operating frequency range is divided into 8 portions in 804, the leakage current and operating voltage for the first test integrated circuit will be measured at 8 randomly selected operating frequencies with each randomly selected operating frequency lying within a different portion of the operating frequency range.

In "Randomize and measure data in additional parts" 812, steps 806 and 808 are repeated for additional test integrated circuits (e.g., additional test integrated circuits from one or more corner lots). Each additional test integrated circuit may be measured (e.g., have the leakage current and operating voltage measured) at different randomly selected frequencies in each frequency portion. Thus, for process 800 with the operating frequency range divided into 8 frequency portions at 804, each additional test integrated circuit will have its leakage current and operating voltage measured in each of the 8 frequency portions with each test integrated circuit having a different randomly selected operating frequency within each of the 8 frequency portions.

After measurement of all the additional test integrated circuits is completed in 812, at least one operating surface equation may be fit to the data in "Fit surface to data 814". As described above, the operating surface equation may be generated to describe a surface that fits the testing data (e.g., a surface similar to surface 702, shown in FIG. 7). The operating surface equation that fits the testing data may define an operating point for an integrated circuit with the selected circuit design as a function of operating voltage, operating frequency, and leakage current.

The use of integrated circuits from corner lots in combination with process 800, shown in FIG. 8, allows testing of a relatively small number of integrated circuit parts to produce a wide range of data sufficient to generate an operating surface equation for integrated circuits using the selected circuit design. For example, testing of approximately 100,000 parts at 8 different frequencies for each part provides 800,000 data points for operating frequency and operating voltage versus leakage current.

Figure 9:
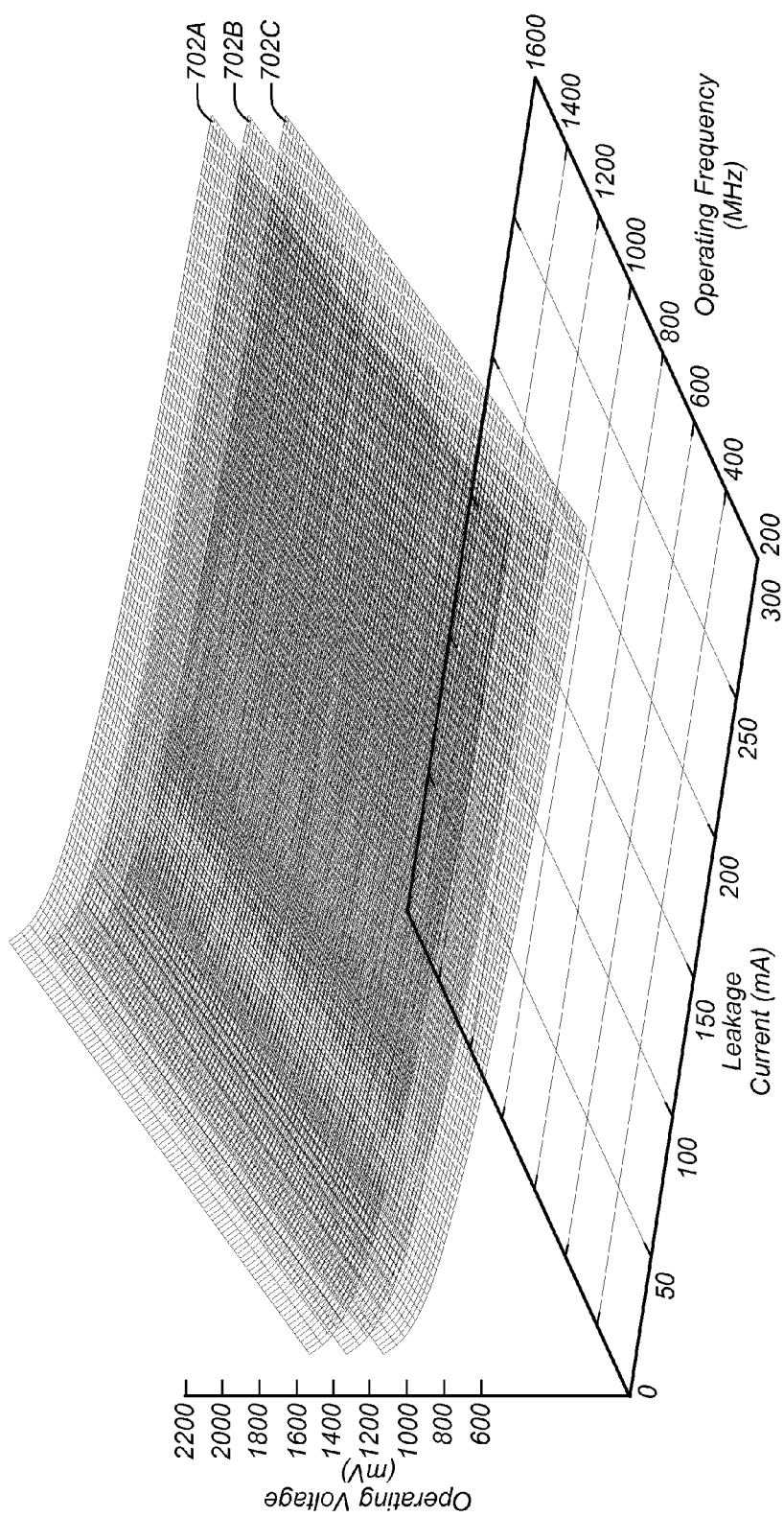
FIG. 9 depicts an embodiment of a plot of testing data with multiple operating surfaces dissecting the population for the testing data.

In some embodiments, multiple operating surface equations are generated for the testing data. For example, multiple operating surface equations may be generated when fabricated integrated circuits are to be binned using the testing data. Each operating surface equation may define a different operating surface that dissects the population for the testing data. FIG. 9 depicts an embodiment of a plot of testing data with multiple operating surfaces dissecting the population for the testing data. As shown in FIG. 9, three operating surfaces 702A, 702B, 702C are defined with each operating surface dissecting a portion of the testing data population. The operating surfaces 702A, 702B, 702C may define different bins for binning of integrated circuits. The number and/or position of the operating surfaces may be varied based on desired binning parameters and/or variations (e.g., statistical spread) in the testing data population.

Figure 10:
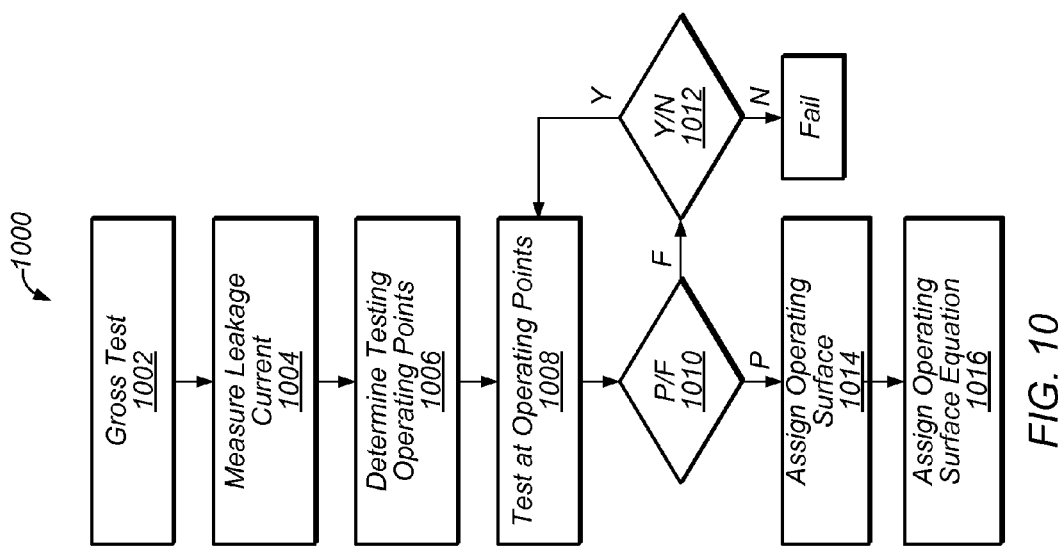
FIG. 10 depicts a flowchart of an embodiment of a binning process for binning integrated circuits with operating surfaces.

In certain embodiments, integrated circuits are binned using data and operating surfaces acquired from process 800, shown in FIG. 8, (or another testing process for accumulating operating frequency and operating voltage versus leakage current data and fitting one or more operating surfaces to the data). Binning of the integrated circuits may be done using a single bin (or operating surface), as shown in FIG. 7, or using multiple bins (operating surfaces), as shown in FIG. 9. FIG. 10 depicts a flowchart of an embodiment of binning process 1000 for binning integrated circuits with the bins (operating surfaces) created by process 800. The integrated circuits binned in process 1000 may have the same circuit design (e.g., the selected circuit design) or a substantially similar circuit design to the integrated circuits tested to create the operatings surfaces shown in FIGS. 7 and 9 (e.g., process 800 shown in FIG. 8).

Process 1000 may begin with testing for gross functionality of the integrated circuit at "Gross Test" 1002. For example, open/short testing and/or scan testing for hard defects may be done at "Gross Test" 1002. If the integrated circuit fails one of the gross functionality tests, the part may not proceed through any further testing and may be thrown away.

After gross functionality testing, process 1000 may continue with measuring the leakage current of an integrated circuit in "Measure leakage current" 1004. The leakage current may be measured at a selected operating voltage and a selected operating frequency. In some embodiments, the leakage current is measured at the highest operating voltage allowed for the selected circuit design and/or the highest operating frequency allowed for the selected circuit design. The leakage current may, however, be measure at any selected operating voltage (e.g., at any desired set value of the operating voltage) and/or any selected operating frequency (e.g., at any desired set value of the operating frequency). It is to be understood that process 1000 may be used on a plurality of integrated circuits with each integrated circuit being processed through process 1000. Thus, when more than one integrated circuit is binned using process 1000, typically the leakage current is measured at the same selected operating voltage and selected operating frequency for each integrated circuit. In some embodiments, if the measured leakage current is above an upper leakage current limit, then the integrated circuit may be failed and not undergo any further testing.

The measured leakage current for the integrated circuit may be used to determine the operating points (e.g., operating voltages and/or operating frequencies) at which the integrated circuit is to be tested in "Determine testing operating points" 1006. The operating points may be determined from the operating surface equations describing the operating surfaces for each bin created during process 800. Using an operating surface equation found during process 800, the measured leakage current from 1004 may be used to determine a curve along an operating surface (e.g., operating surface 702A, 702B, or 702C, shown in FIG. 9) that corresponds to the measured leakage current. One or more operating points may be selected along this curve on the operating surface at the measured leakage current to be used for testing the integrated circuit. The operating points may correspond to intersections of the measured leakage current with operating voltage and operating frequency along the operating surface defined by the operating surface equation. Thus, each operating point defines an operating voltage and operating frequency that lies along the operating surface and corresponds to the measured leakage current.

After determining the testing operating points in 1006, the integrated circuit may be tested at the operating points in "Test at operating points" 1008, as shown in FIG. 10. In 1008, the integrated circuit may be tested at one or more operating points along each operating surface to be tested (e.g., the integrated circuit may be tested at one or more operating points along each operating surface 702A, 702B, and/or 702C, shown in FIG. 9). In certain embodiments, the integrated circuit is tested at multiple operating points (e.g., 4-6 operating points) along an operating surface. Testing the integrated circuit at multiple operating points along the operating surface may provide increased accuracy in determining if the integrated circuit passes or fails testing for the bin defined by the operating surface.

In certain embodiments, as shown in FIG. 10, testing begins with the lowest operating surface (bin) (e.g., operating surface 702C is the lowest operating surface shown in FIG. 9). Beginning with the lowest operating surface allows for the fewest number of testing operations as the integrated circuit does not have to undergo further testing at higher operating surfaces if the integrated circuit passes testing at the lowest operating surface. At "P/F" 1010, the integrated circuit is either passed or failed at the tested operating surface. Passing or failure of the integrated circuit may be based on passing or failure of the integrated circuit on a selected percentage of the operating points along the tested operating surface. For example, if the integrated circuit is tested at 6 operating points along the tested operating surface, the integrated circuit may need to pass the test at 4 or more points to be considered as passing the test at the tested operating surface. The margin for testing along the tested operating surface may be determined based on, for example, statistical accuracy of the testing data and/or the operating surface equations used to define the operating surfaces.

If the integrated circuit passes "P", the integrated circuit is assigned to that operating surface at "Assign operating surface" 1014. If the integrated circuit fails "F", then the question is posed if there is another operating surface for testing at "Y/N" 1012. If "Y", then the integrated circuit is tested at one or more operating points along another (higher) operating surface in 1008. If "N", then the integrated circuit is failed.

In some embodiments, the integrated circuit is tested at the highest operating surface first (similar to testing at the highest operating voltage first, as shown in the embodiment of process 300' depicted in FIG. 6). When the integrated circuit is tested at the highest operating surface first, the integrated circuit may be assigned to the lowest operating surface at which the integrated surface passes testing after testing at each operating surface is completed. In some embodiments, if the integrated circuit fails testing the highest operatings surface, the integrated circuit is failed immediately and no further testing is done.

After the integrated circuit is assigned an operating surface at 1014, the integrated circuit is assigned an operating surface equation corresponding to the operating surface at "Assign operating surface equation" 1016. Thus, the integrated circuit is now assigned an operating surface equation that defines operating points for the integrated circuit as a function of operating voltage, operating frequency, and leakage current.

In certain embodiments, the operating surface equation assigned to the integrated circuit is programmed into the integrated circuit (e.g., programmed into the logic of the integrated circuit). For example, the operating surface equation may be programmed into a fuse block containing one or more fuses in the integrated circuit (e.g., fuse block 106, shown in FIG. 1). The measured leakage current of the integrated circuit may also be programmed into the integrated circuit (e.g., fused into the integrated circuit). In some embodiments, the operating surface equation found using process 800, shown in FIG. 8, (or another similar testing process for accumulating operating frequency and operating voltage versus leakage current data) is programmed into an integrated circuit fabricated with the selected circuit design without the integrated circuit going through a binning process such as process 1000, shown in FIG. 10.

In some embodiments, the operating surface equation and/or the measured leakage current are programmed into software executable by a processor (e.g., the device and/or the integrated circuit). In some embodiments, the operating surface equation is stored as program instructions in a computer readable storage medium (e.g., a non-transitory computer readable storage medium) and the operating surface equation is executable by the processor.

With the operating surface equation programmed into the integrated circuit (such as integrated circuit 102, shown in FIG. 1), device 100 may operate at an operating voltage determined, at a given operating frequency, using the operating surface equation and the leakage current programmed into the integrated circuit. For example, the given operating frequency may be selected or determined based on a desired operation of device 100 (e.g., the operating frequency may be given based on a certain operation of the device). The given operating frequency may then be input into the operating surface equation (e.g., the operating frequency may be given as an input to the logic of the integrated circuit). The operating surface equation may then determine an operating voltage for the integrated circuit using the given operating frequency and the fused leakage current value. The determined operating voltage value may then be provided to power supply 104, which is sets its output voltage to integrated circuit 102 at the determined operating voltage.

Having the operating surface equation and the leakage current programmed into the integrated circuit allows the operating voltage to be adjusted based on the desired or given operating frequency of the integrated circuit. For example, the operating point of the integrated circuit on its operating surface (defined by the operating surface equation) is adjusted based on the given operating frequency of the integrated circuit. Thus, the integrated circuit can traverse up and down an operating voltage versus operating frequency curve along the operating surface as defined by the fused leakage current with the traverse up and down the curve being determined using the operating surface equation.

In certain embodiments, with the operating surface equation programmed into the integrated circuit, the frequency of the integrated circuit may be varied within a specified frequency range (e.g., the integrated circuit is allowed to operate at any operating frequency within the specified frequency range). The operating voltage is then adjusted to compensate for changes in the frequency using the programmed operating surface equation and the fused leakage current (e.g., a new operating point along the operating voltage versus operating frequency curve is found using the programmed operating surface equation). Adjustment of the operating voltage in view of changes in the frequency helps manage thermal and performance levels and improves operation efficiency of the device.

In some embodiments, the specified frequency range is determined by the operating surface equation. For example, the specified frequency range may be programmed in as part of the operating surface equation. In certain embodiments, the operating frequency is continuously variable within the specified frequency range. For example, the operating frequency may be stepped (e.g., raised or lowered) any amount within the specified frequency range. Variation of the operating frequency allows the integrated circuit to be used for multiple programs without the need for re-characterization of the integrated circuit (e.g., there is no need for characterization of the integrated circuit at another operating frequency to switch programs as the operating surface equation programmed into the integrated circuit allows the operating frequency to be changed). Without the need for re-characterization, turnaround times for changing programs is reduced.

The ability to change operating frequencies also allows algorithms that involve thermal management and/or performance management to be fully implemented and achieve their maximum potential. Adjustment of the operating frequency within the specified frequency range provides fine grain control for both thermal management and performance management over a wide range of frequencies. The programmed operating surface equation allows large increases or decreases in operating frequency to be implemented as needed. For example, the programmed operating surface equation allows large steps downward in the operating frequency (in a controlled fashion) to reduce temperature in the device and provide thermal management of the device. Similarly, the programmed operating surface equation allows large steps upward in the operating frequency (in a controlled fashion) to increase performance in the device and provide performance control of the device.

In certain embodiments, one or more process steps described herein are operated using software executable by a processor (e.g., an integrated circuit). For example, process 800 or process 100, shown in FIGS. 8 and 10, respectively, may have one or more steps controlled or operated using software executable by the processor. In some embodiments, the process steps are stored as program instructions in a computer readable storage medium (e.g., a non-transitory computer readable storage medium) and the program instructions are executable by the processor.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A device, comprising:
an integrated circuit programmed with an operating surface equation that defines an operating point as a function of operating voltage, operating frequency, and leakage current, wherein the operating surface equation is generated prior to manufacture of the integrated circuit, the operating surface equation is generated by fitting a surface equation to data for operating voltage and operating frequency versus leakage current for a plurality of test integrated circuits;
wherein an operating voltage of the integrated circuit at a given operating frequency is determined by the integrated circuit evaluating the operating surface equation at the given operating frequency and at least one leakage current value fused into the device, wherein the leakage current value is determined during a test of the integrated circuit.

2. The device of claim 1, wherein the at least one leakage current value fused into the device comprises a leakage current of the integrated circuit measured at a selected operating voltage and a selected operating frequency.

3. The device of claim 1, wherein the plurality of test integrated circuits comprise a substantially similar design to the integrated circuit.

4. The device of claim 1, wherein the integrated circuit is allowed to operate at any operating frequency within a specified frequency range.

5. The device of claim 4, wherein the specified frequency range is determined by the operating surface equation.

6. The device of claim 4, wherein the operating frequency is continuously variable within the specified frequency range.

7. The device of claim 1, wherein the given operating frequency of the integrated circuit is raised or lowered in response to thermal management and/or performance control needs of the integrated circuit.

8. The device of claim 1, wherein the integrated circuit is operable at more than one operating point at the at least one fused leakage current value as defined by the operating surface equation.

9. A method, comprising:
measuring leakage current and operating voltage of an integrated circuit at a first randomly selected operating frequency, wherein the first randomly selected operating frequency is within a desired operating frequency range;
measuring leakage current and operating voltage of the integrated circuit at one or more additional randomly selected operating frequencies, wherein the additional randomly selected operating frequencies are within the desired operating frequency range, and wherein the additional randomly selected operating frequencies each comprise different operating frequencies from each other and the first randomly selected operating frequency;
generating operating voltage and operating frequency versus leakage current data from the measured leakage currents and operating voltages at the different randomly selected operating frequencies; and
fitting at least one operating surface equation to the operating voltage and operating frequency versus leakage current data, wherein the operating surface equation defines an operating point for the integrated circuit as a function of operating voltage, operating frequency, and leakage current.

10. The method of claim 9, wherein the integrated circuit comprises a corner lot integrated circuit.

11. The method of claim 9, further comprising dividing the desired operating frequency range into two or more portions, wherein the randomly selected operating frequencies are each selected from a different portion of the desired operating frequency range.

12. The method of claim 11, wherein the desired operating frequency range is divided into substantially equal portions.

13. The method of claim 9, further comprising measuring leakage current and operating voltage of the integrated circuit at 8 or more randomly selected operating frequencies.

14. The method of claim 9, further comprising:
measuring leakage current and operating voltage of one or more additional integrated circuits at two or more additional randomly selected operating frequencies, wherein the additional integrated circuits comprise a substantially similar design to the integrated circuit;
generating operating voltage and operating frequency versus leakage current data from the measured leakage currents and operating voltages at the different randomly selected operating frequencies for the additional integrated circuits;
combining the operating voltage and operating frequency versus leakage current data for the additional integrated circuits with the operating voltage and operating frequency versus leakage current data for the integrated circuit; and
fitting at least one operating surface equation to the combined operating voltage and operating frequency versus leakage current data, wherein the operating surface equation defines operating points for the integrated circuits as a function of operating voltage, operating frequency, and leakage current.

15. The method of claim 14, further comprising programming the at least one operating surface equation into one or more integrated circuits comprising a substantially similar design to the integrated circuit.

16. A method, comprising:
measuring a leakage current of an integrated circuit at a selected operating voltage and a selected operating frequency;
testing the integrated circuit at one or more operating points along a first operating surface defined by a first operating surface equation to ensure correct functionality of the integrated circuit at each operating point, wherein the first operating surface equation defines an operating point for the integrated circuit as a function of operating voltage, operating frequency, and leakage current, and wherein the tested operating points along the first operating surface are determined in response to the measured leakage current;
testing the integrated circuit at one or more operating points along at least one additional operating surface defined by at least one additional operating surface equation to ensure correct functionality of the integrated circuit at each operating point, wherein the at least one additional operating surface equation defines an operating point for the integrated circuit as a function of operating voltage, operating frequency, and leakage current, and wherein the tested operating points along the at least one additional operating surface are determined in response to the measured leakage current; and
assigning the integrated circuit with at least one of the operating surface equations, wherein the integrated circuit passes the test at at least one of the operating points corresponding to the assigned operating surface equation.

17. The method of claim 16, wherein the tested operating points correspond to intersections of the measured leakage current with operating voltage and operating frequency along the operating surfaces defined by the operating surface equations.

18. The method of claim 16, wherein the operating surface equations have been generated by fitting the operating surface equations to testing data of operating voltage and operating frequency versus leakage current for a plurality of test integrated circuits, wherein the test integrated circuits comprise a substantially similar design to the integrated circuit.

19. The method of claim 16, further comprising testing the integrated circuit at more than one operating point along each of the operating surfaces.

20. The method of claim 16, further comprising programming the integrated circuit with at least one of the operating surface equations, wherein the integrated circuit passes the test at at least one of the operating points corresponding to the programmed operating surface equation.

* * * * *